United States Patent

Murakami

[11] Patent Number: 5,572,564
[45] Date of Patent: Nov. 5, 1996

[54] REFLECTING PHOTO MASK FOR X-RAY EXPOSURE AND METHOD FOR MANUFACTURING THE SAME

[75] Inventor: Katsuhiko Murakami, Kanagawa, Japan

[73] Assignee: Nikon Corporation, Tokyo, Japan

[21] Appl. No.: 441,660

[22] Filed: May 15, 1995

Related U.S. Application Data

[63] Continuation of Ser. No. 288,157, Aug. 9, 1994, abandoned, which is a continuation of Ser. No. 119,887, Sep. 10, 1993, abandoned, which is a continuation of Ser. No. 14,093, Feb. 4, 1993, abandoned, which is a continuation of Ser. No. 822,338, Jan. 17, 1992, abandoned.

[30] Foreign Application Priority Data

Jan. 23, 1991 [JP] Japan ..................................... 3-021461

[51] Int. Cl.$^6$ ..................................................... G21K 5/00
[52] U.S. Cl. .................................... 378/35; 378/34; 430/5
[58] Field of Search ......................... 378/34, 35; 430/5

[56] References Cited

U.S. PATENT DOCUMENTS 4,891,830 1/1990 Iwahashi ................................... 378/35
5,052,033 9/1991 Ikeda et al. ............................... 378/35

*Primary Examiner*—Craig E. Church
*Attorney, Agent, or Firm*—Michael N. Meller

[57] ABSTRACT

Reflection-type mask for X-ray exposure generating a high contrast of the edge part of a mask pattern and capable of transferring the mask pattern in an accurate and clear manner. The mask, is provided with a substrate composed of a material that does not reflect X-ray radiation and an X-ray reflectable multilayer patterned on the substrate. The substrate is formed such that at least a part of the edge faces of the pattern comprising the multilayer is formed as substantial slant face parallel to the direction of the exit direction of the parallel X-ray beam incident into the multilayer after the reflection thereof on a plurality of the interfaces between the layers within the multilayer. The mask can be manufactured by irradiating an ion beam from a slant direction onto the multilayer on which is formed a resist pattern thereby effecting the etching.

15 Claims, 4 Drawing Sheets

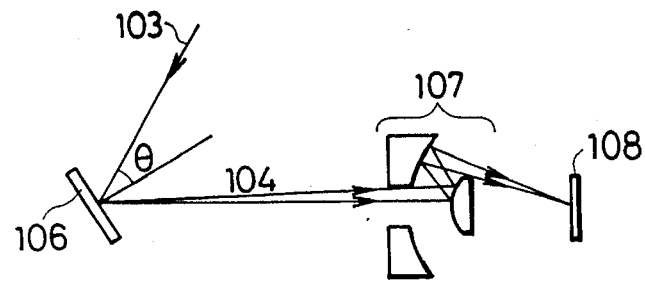
F I G. 3
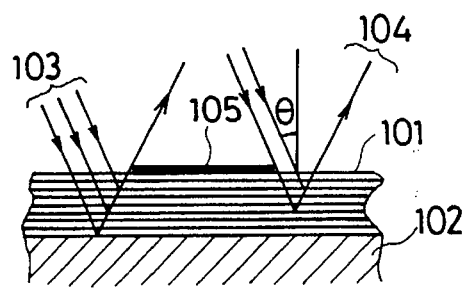
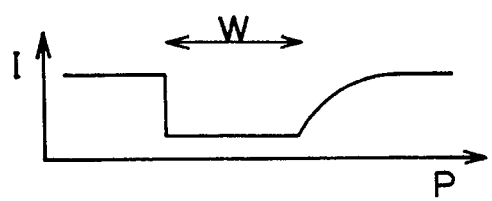
F I G. 4a
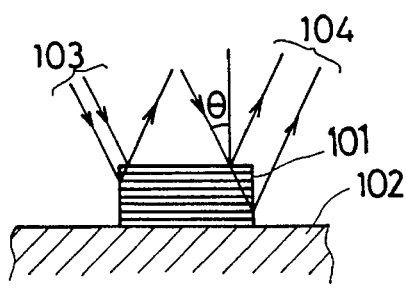
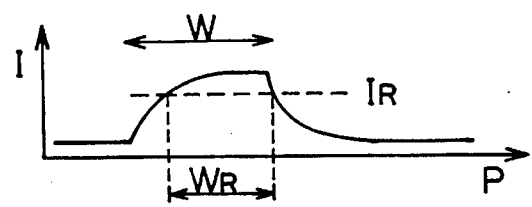
F I G. 4b

REFLECTING PHOTO MASK FOR X-RAY EXPOSURE AND METHOD FOR MANUFACTURING THE SAME

This application is a continuation of Ser. No. 08/288,157, filed Aug. 9, 1994, now abandoned; which is a continuation of Ser. No. 08/119,887, filed Sep. 10, 1993, now abandoned; which is a continuation of Ser. No. 08/014,093, filed Feb. 4, 1993, now abandoned; which is a continuation of Ser. No. 07/822,338, filed Jan. 17, 1992, now abandoned.

BACKGROUND OF THE INVENTION

1. Field of the Invention

The present invention relates to a reflection-type photo mask principally for use in X-ray projection exposure during the manufacturing process of semiconductor devices and the like.

2. Description of the Prior Art

Attention has been focused recently on lithography utilizing the X ray of a shorter wave length compared with ultraviolet ray. X-ray lithography is considered advantageous in that it can achieve higher resolution. This high resolution is theoretically impossible for lithography utilizing ultraviolet rays.

According to conventional X-ray lithography, so-called transmission-type X-ray masks have been used in which a desirable pattern is formed with a thin film member comprising an X-ray absorbing material onto a membrane of a thickness of about 2 μm and comprising a material with relatively good X-ray transmission, for example silicone nitride. With X-ray irradiation these masks, a projection image of the mask pattern by the X ray transmitting through the part except for the pattern part is generated on the photo resist layer on the surface of wafer, which is employed for effecting lithography.

The following problems have been suggested about such transmission-type X-ray masks because thin membranes are employed in such masks.

1. Because the membranes per se are thin, such masks are readily breakable, and handling is difficult.
2. Because the membranes are in the form of a thin film, deformation is induced in the membranes due to the inner stress in X-ray absorbing materials, with resulting occurrences of positional distortion in the projected pattern image.
3. On X-ray irradiation, the temperature of the masks is raised due to the X ray energy absorbed into the membranes per se and the X-ray absorbing materials, and thermal expansion of the membrane and x-ray absorbing matter develops positional distortion in the pattern.

In order to solve these problems, reflection-type X-ray masks have been developed. In reflection-type X-ray masks, substrates in the form of thick board are used, instead of thin membranes. FIG. 2a shows one example of such masks such that an X-ray reflectable multilayer 101 is formed on the entire surface thereof and a pattern is formed with X-ray absorbing material 105. FIG. 2b shows that on X-ray unreflectable substrate 102 a desirable pattern is formed with X-ray reflectable multilayer 101.

By means of an optical system, the light transmitted through a mask generates an image on the surface of a substrate in transmission-type X-ray masks, while the light reflected on the pattern surface of a mask generates an image on a substrate in such reflection-type X-ray masks. Because a thin membrane is not utilized in such reflection-type masks, the individual problems described above can be solved which are encountered with transmission-type masks.

However, a newly developed problem concerning such reflection-type X-ray masks has been suggested. When using a reflection-type X-ray mask 106, as is shown in FIG. 3, it is required that the optical axis of the incident light 103 be arranged not to be co-incident with the optical axis of reflection light 104, in order that optical system 107 which works to generate an image on substrate 108 from the reflected light 104 on the mask 106 should not interfere with the incident light 103 into the mask 106. Therefore, the incidence of the X ray into the mask 106 is absolutely required to be arranged in the form of grazing incidence, not in the form of vertical incidence.

The X ray incident into multilayer 101 (FIGS. 2a and 2b) of a mask penetrates into the multilayer in the depth direction thereof at some degree, and thereafter the X ray is partially on the interface of the individual layers within the multilayer. Hence, the partially overlaid reflection on a large number of the individual layers within the multilayer is utilized as the reflected X ray for generating an image.

For this reason, the intensity of reflected X ray 104 is lowered near the edge on the opposite side to the direction of X-ray incident direction of a pattern 105 of an absorbing material, where the pattern of the absorbing material 105 is formed on the X-ray reflectable multilayer (see FIG. 2a). FIG. 4a, concerns the reflected X ray which exits from the multilayer exposing part near the edge. The part of the X ray should be incident to multilayer and should essentially form reflected X ray disturbed by the pattern 104 of an absorbing material. Consequently, no overlap is observed in some of the reflected X ray 104 on the individual interfaces at the portion of the pattern. This produces consequent a lowered reflection intensity. Therefore, the distribution of intensity I of reflected X ray, on position P in the pitch direction of the mask pattern, has a diversity in the form of exponential curve. In FIG. 4a W represents the width of a pattern.

When a pattern comprising X-ray reflectable multilayer 101 is formed on an X-ray unreflectable substrate 102 (see FIG. 2b), a problem is suggested about the reflection intensity in the proximity of both edges on the incident and exit sides to the incident direction of X ray, as is shown in FIG. 4b.

There is less overlapping of reflected X ray on the interfaces of individual layers, because incident X ray 103 does not reach a sufficient depth within the multilayer 101 so that no reflection is induced from the reflection surface below. Therefore, the intensity of the reflected X ray 104 on the X-ray incident side has a distribution in the form of exponential curve as is shown in FIG. 4b. Thus, the reflection intensity on the pattern edge is low.

The X-ray which is reflected within the multilayers 101 and exits from the edge part constitutes the pattern. The intensity of the X ray also has a distribution in the form of exponential curve, as is shown in FIG. 4b.

With respect to FIG. 4b, it may be considered that the influences on both of the edges of the pattern work to negate each other. As is shown in the figure, however, a problem occurs in that the width Wr of the range in which the quantity of light $I_R$ to be required for exposure of resist generally is changed into a different one from the original pattern width W of a mask.

The diversity in the form of exponential curve of the distribution of the reflection intensity on (and around) these edges is represented in either case approximately as $\exp(-\mu X/\sin\theta)$ if X, μ and θ are defined as representing the position in coordinate in the same direction as P, a linear coefficient and incident angle, respectively.

When the X ray of a wave length of 124 angstroms irradiates a multilayer comprising Mo/Si at an angle of 45°, for example, the position with a 1/e-fold reflection intensity corresponds to a position in distance by about 0.13 μm apart from the pattern edge, which is never negligible in a projection image of a microfine circuit pattern.

As has been described above, a serious problem has been suggested about conventional reflection type mask for X-ray exposure in that a pattern on a mask cannot be precisely transferred on a substrate in either type as in FIG. 2a (FIG. 4a) or FIG. 2b (FIG. 4b).

SUMMARY OF THE INVENTION

It is a major objective of the present invention to provide a reflection-type mask for X-ray exposure capable of accurate and clear transfer of a mask pattern, in particular as a high-contrast image of an edge bordering part, wherein it is prevented that the reflected X ray on the edge part of a mask pattern may have a diffuse intensity distribution in the form of exponential curve on the surface of a substrate; and to provide a method for manufacturing the same.

The mask for X-ray exposure according to the concept of the present invention is a mask provided with a substrate composed of a material that does not reflect X-ray radiation along with a multilayer being patterned on the substrate and being reflectable of X ray. In order to achieve the objective described above, at least a part of the edge part of the pattern comprising the multilayer is formed preferably in smooth slant face approximately parallel to the exit direction of the X ray reflected on the interfaces between the individual layers within the multilayer, namely the exit direction of the X ray after its reflection on the interfaces among a plurality of layers within the multilayer.

Since the reflection-type X-ray mask of the present invention is formed as described above, the reflected X ray which exits from the proximity of the pattern edge of the multilayer (inside the pattern) is composed of the X ray partially reflected on the interfaces of all of the layers within the multilayer, so the reflected X ray which exits from any part of the pattern has an identical reflection intensity.

The edge surface may not necessarily be smooth slant face. However a slant face in a step-wise form corresponding to each layer in the etching of the multilayer may be satisfactory. As the slant face is as smooth as possible, there may be less X ray exiting from the edge surface of the pattern after the reflection thereof on any interface within the multilayer, leading to a drastic decrease to zero of the intensity of the reflected X ray on the outside of the pattern with the border of the pattern edge. This produces a highly-contrasted pattern image.

Accordingly, the mask of the present invention if used can generate an accurate projection of a mask pattern on a substrate, by the exposure to the X ray in the incident direction preliminarily determined according to the direction of the slope of the slant face of the edge face, which enables transfer of the pattern in the accurate size thereof on wafer during the process of lithography. If the mask of the present invention is used, an extremely high contrast is obtained of the pattern image on a substrate, with the border of the pattern edge. An image in clear resolution can be obtained even for a microfine pattern.

The process of manufacturing a mask for X-ray exposure, in accordance with the basic embodiment of the present invention, has each of the following processes;
(a) a process of forming an X-ray reflectable multilayer on a substrate formed from a material;
(b) a process of forming a desirable resist pattern on the multilayer;
(c) a process of irradiating an ion beam onto the multilayer on which is formed the resist pattern, from a preliminarily defined slant direction, to effect etching of the multilayer in the form of the resist pattern; and
(d) a process of removing the resist pattern after the completion of the etching process.

According to the manufacturing process, the adjustment of the incident angle of ion beam enables to form the edge faces of the multilayer pattern as the slant face along a desirable exit direction of reflected X ray. The exit direction of reflected X ray can absolutely be defined, individually depending on the configuration of each X-ray exposure system, such as X-ray optical system, mask holder or the like.

The objectives described above and other objectives of the present invention, characteristic features and advantages thereof will now be understood further in the following detailed explanation with reference to attached drawings illustrating non-limiting examples.

BRIEF DESCRIPTION OF THE DRAWINGS

FIGS. 2a and 2b are schematic partially sectional views of conventional reflection-type masks for X-ray exposure, being of different types, wherein FIG. 2a represents a type in which an absorbing material is patterned and FIG. 2b represents a type in which an X-ray reflectable multilayer is patterned;

FIG. 3 is a conceptual block diagram of an optical pass in a scaled-down projection-exposure system using a reflection-type mask for X-ray exposure;

FIGS. 4a and 4b are explanatory views of the state as to how reflection is effected by the conventional reflection-type masks for X-ray exposure shown in FIGS. 2a and 2b, respectively;

FIG. 4a is an explanatory view of the problems about the type in which an absorbing material is patterned; and FIG. 4b is an explanatory view of the problems about the type in which an X-ray reflection multilayer is patterned;

DESCRIPTION OF THE PREFERRED EMBODIMENTS

Figure 1:
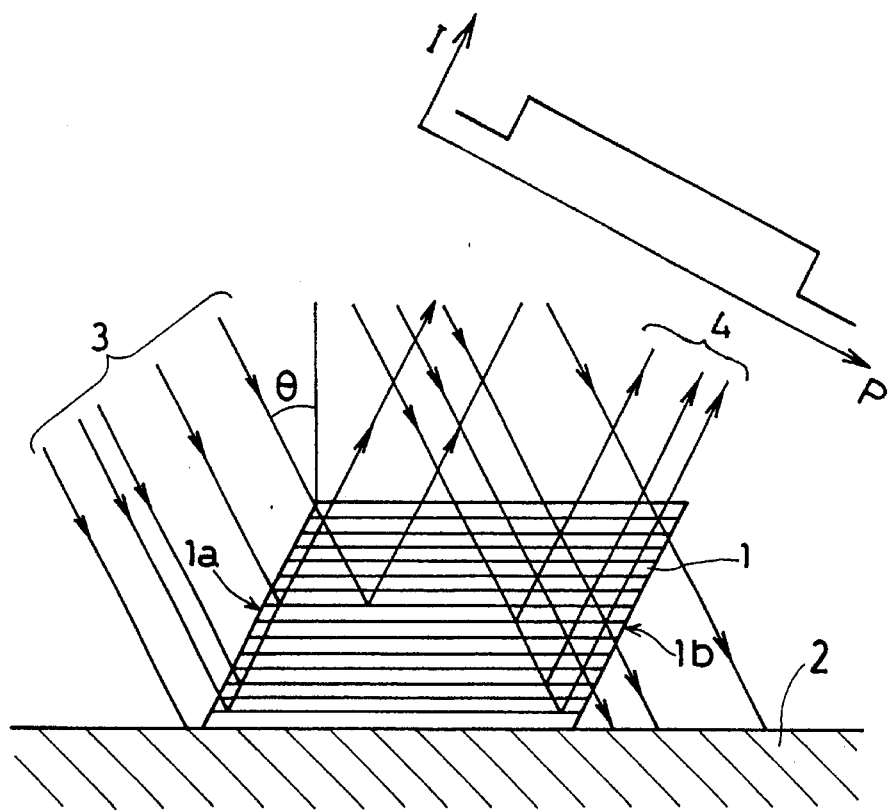
FIG. 1 is a schematic cross sectional view of a reflection-type mask for X-ray exposure, in accordance with the present invention, with a graph of the distribution of the corresponding X-ray intensity of a pattern.
Figure 2A:
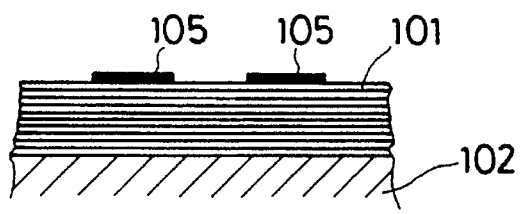
Figure 2B:
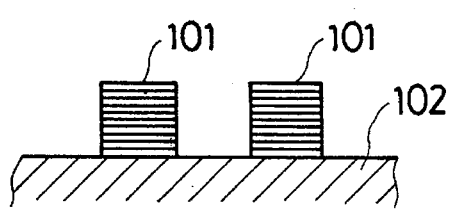

FIG. 1 is a schematic cross sectional view of the pattern part of a reflection-type mask for X-ray exposure, in accordance with the present invention, with a graph of the distribution of X-ray intensity I in the position P in the pitch direction of the mask pattern corresponding to it. In the reflection-type mask for X-ray exposure shown in FIG. 1, a desirable pattern composed of X-ray reflectable multi layer 1 is formed partially on substrate 2 composed of a material that does not reflect X-ray radiation.

At the essential use of such mask, the incident X ray 3 into the multilayer 1 is reflected on the interface of each layer 5 within the multilayer and exits as reflected X ray 4; the cross section of the multilayer 1, represented on the paper face of FIG. 1, is a face where the reflected X ray 4 is included when the mask of the present invention is used, while the individual edge faces of the multilayer pattern are formed as slant faces 1a and 1b, in almost parallel with the exit direction of X ray.

In the example, if viewed from the parallel cross section to the incident face, the edge faces 1a and 1b on the incident and exit sides of the cross section have separately a slope approximately consistent with the exit direction of the X ray after the reflection thereof on the interface of each layer within the multilayer 1. Consequently, the cross sectional form of the multilayer 1 represented on the paper face of FIG. 1 is parallelogram with the oblique sides being parallel with the progressing direction of the reflected X ray 4.

By such a configuration, all of the layers within the multilayer (i.e. the interfaces) contribute to overlapping of reflection light, even in the proximity of the pattern edges (inside the pattern) on the incident side of X ray, so no reduction in reflection intensity occurs, as is observed in conventional examples.

In the proximity of the pattern edges on the exit side of X ray (outside of the pattern), no exit X ray from the part of the pattern edge face is generated, as is observed in conventional examples. Consequently, at the pattern edge part, no diversity in the form of exponential curve of the intensity distribution of reflected X ray reaching the side of a substrate.

One example of manufacturing such a reflection-type mask for X-ray exposure is illustrated below. On substrate 2 composed of Si as a material that does reflect X-ray radiation, 50 periods of Mo layer and Si layer, were formed to form multilayer 1 of a period length of 88 angstroms. A line-and-space pattern of 1 μm was formed on multilayer 1 as a resist pattern, according to photolithography.

Figure 5:
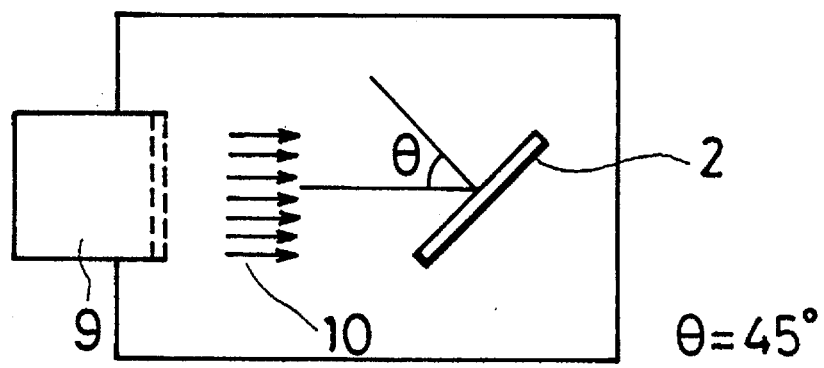
FIG. 5 is sequential explanatory views of the manufacturing process of a reflection-type mask for X-ray exposure by ion milling process, in accordance with one embodiment of the present invention.

Thereafter, etching of the multilayer 1 was effected by an ion milling system as shown in FIG. 5. During the etching, the substrate 2 with the multilayer 1 being formed thereon was arranged, in slant manner with an angle of 45° to the incident direction of ion beam 10 from ion beam generator 9. The pattern direction of the mask was set up to be vertical to the incident direction of the ion beam (the paper face of FIG. 5), whereby the edge faces of the pattern line part, individually formed by the multilayer 1, became slant faces having an angle of 45° to the substrate 2. If viewed in the cross sectional forms, a pattern of the multilayer, in the form of parallelogram with the oblique sides having a slope of 45°, was formed. Finally, the resist remaining was removed to complete a reflection-type mask for X-ray exposure as shown in FIG. 1.

The types of ions for the irradiation in etching may be inert gases or reactive gases, or a mixture of inert gases and reactive gases.

The inert gases include Ar (argon), Kr (krypton), Xe (xenon) and the like. In this case, physical sputter-etching is effected. The inert gases if used have advantageous in that etching can be effected, notwithstanding any of the types of the materials of the multilayer.

The reactive gases include $CF_4$, $CCl_4$, $CHF_3$, $O_2$ and the like. In this case, chemical etching involving chemical reaction is effected. The reactive gases if used can promote the etching rate, although the material of the multilayer is necessarily changed into a volatile substance such as halides.

If the ratio of a material etching rate to a resist etching rate is defined as a selectable ratio and the selectable ratio is not satisfactory, the resist forming the pattern is more rapidly etched than the material so the material cannot be etched in a desirable pattern.

In etching, therefore, a multilayer resist process realizing a larger thickness of resist film is utilized if the selectable ratio of a monolayer resist is not satisfactory. Examples therefor are depicted in FIGS. 7a and 7b.

Figure 7A:
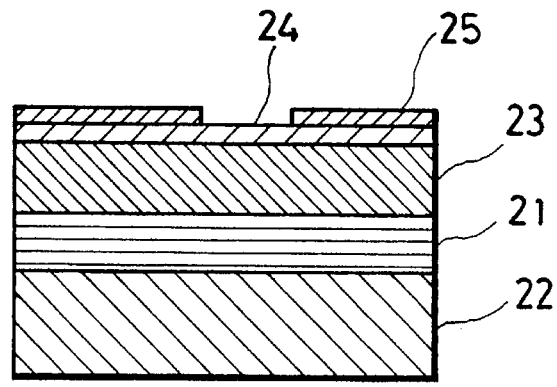
FIGS. 7a to 7e are schematic cross sectional views of etching process in etching a multilayer by multilayer resist process.
Figure 7B:
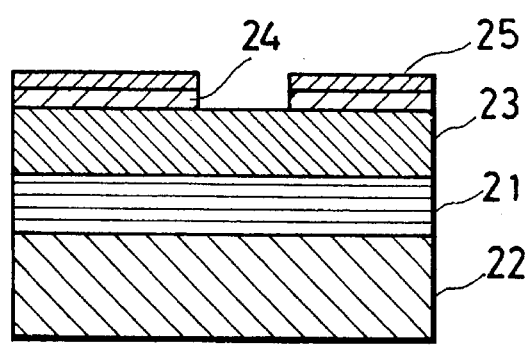

As is shown in FIG. 7a, multilayer 21 is formed on substrate 22, on which resin layer 23 of a first resist, polyimide or the like is formed. Furthermore, $SiO_2$ layer 24 is formed as an intermediate layer on the resin layer 23, and a second resist layer 25 is simultaneously formed further on the $SiO_2$ layer 24.

The first resist (or polyimide resin) layer 23 should have a film thickness sufficient enough to work as a mask in the etching of multilayer 21.

The $SiO_2$ layer 24 is for patterning the first resist (or polyimide resin) layer 23. In ion milling, the $SiO_2$ layer 24 has a higher selectable ratio relative to the resist, so the film thickness thereof may be thin, satisfactorily.

The second resist layer 25 is a resin layer similar to the first resist layer, which works as a mask for effecting the etching of the $SiO_2$ layer 24 as the layer below thereof. The etching of the $SiO_2$ layer 24 is effected with the reactive gases, so the thickness of the second resist layer 25 may be thin.

During the etching, patterning is effected by photolithography in order that the second resist layer 25 acquires a desirable mask pattern (FIG. 7a).

Then, a reactive gas such as $CHF_3$ and the like is used to effect etching of the $SiO_2$ layer 24 (FIG. 7b).

After the completion of the etching of the $SiO_2$ layer 24, the second resist layer 25 remaining on the surface is removed.

Figure 7C:
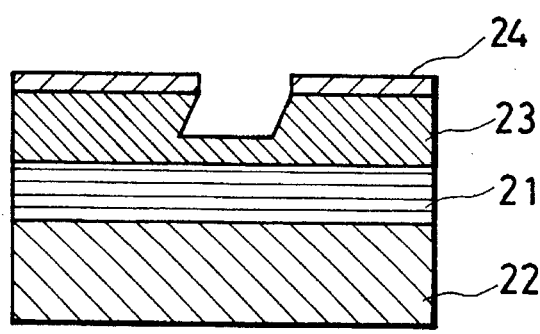

Subsequently, the irradiation of ion beam on the substrate 22 is effected in the state of grazing incidence. The ion then may be an inert gas ion such as Ar, or a gas for chemical etching of a multilayer material, such as $CF_4$, $CCl_4$ and the like. Through the process, etching of the first resist (or polyimide resin) layer 23 is effected in a slant form. (FIG. 7c)

Figure 7D:
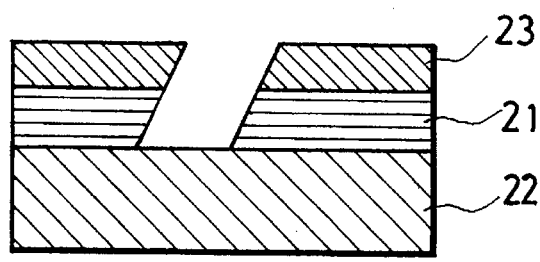

When the surface of the multilayer 21 is subsequently exposed, the multilayer 21 in a pattern following the resist pattern is etched in a slant form in the cross section of the mask. During the process, the $SiO_2$ layer 24 on the surface is also etched little by little, which layer is almost eliminated at the completion of the etching of the multilayer 21. (FIG. 7d)

Figure 7E:
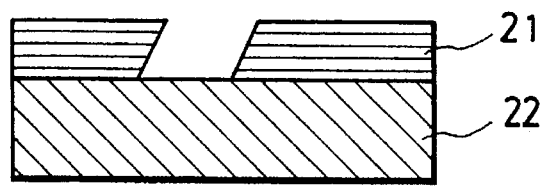

Finally, the first resist (or polyimide resin) layer 23 remaining is removed to form a reflection-type mask for X ray exposure of a desirable pattern. (FIG. 7e)

Figure 6:
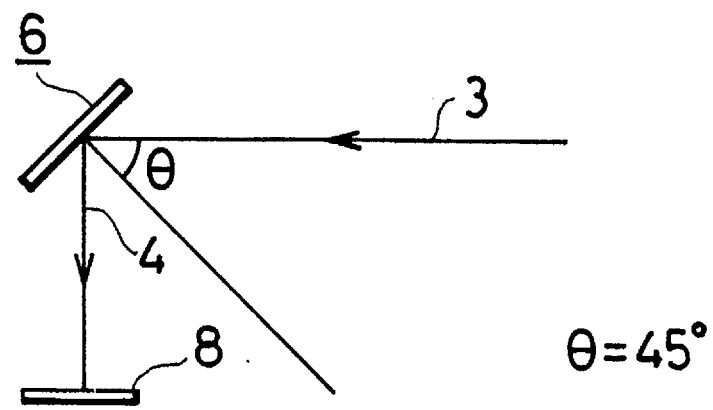
FIG. 6 is a view of optical pass to explain the condition of arrangement at the exposure test of a reflection-type mask for X-ray exposure in accordance with one embodiment of the present invention.

With reference to FIG. 6, there will follow a description of the results of exposure tests which were carried out by using the reflection-type mask for X-ray exposure in accordance with the present invention.

As is shown in FIG. 6, the X-ray beam of a wave length of 124 angstroms, which was obtained through spectroscopy of radiation, was made incident into the reflection-type mask for X-ray exposure 6 at an angle of 45°. Then, an image with reflected X ray 4 was transferred to Si wafer 8 coated with positive-type PMMA resist. In this case, the pitch direction of the line-and-space pattern of the mask was arranged to be parallel to the incident face (paper face of FIG. 6).

Because the mask was herein slanted at 45°, the pattern width of the mask if projected on the wafer can be converted into a line-and-space of 0.7 μm. When the pattern of the formed wafer was actually measured, a line-and-space of 0.7 µm was accurately transferred onto the wafer.

For comparison, an identical experiment was carried out by using a reflection-type mask for X-ray exposure manufactured following conventional examples, wherein the edge faces of a multilayer pattern were not slanted. On measuring the outcome of the transfer, the width of the pattern part got as wide as 0.8 µm, and the width of the space part got as narrow as 0.6 µm. That is, no accurate transfer of the pattern on the mask onto the wafer could be achieved.

In the present example, no special reduction of the pattern image through an optical system was effected. For the actual use in a process, however, a pattern image is reduced about 1/10 fold, by passing the reflected X ray on mask 6 through a reduction optical system 7 composed of a multilayer mirror and the like, as is explained in FIG. 3, thereby enabling accurate transfer of such pattern.

The individual examples described insofar are those for illustrating the present invention, and should not be interpreted to a limitation. The present invention includes various versions or modifications, possibly employed by the skilled person in the art in a variety of manners not shown herein.

What is claimed is:

1. Reflection-type mask for X-ray exposure using a beam of substantially parallel X-rays incident into the mask for generating reflected X-rays so as to form a mask pattern image, comprising a substrate composed of X-ray unreflectable material and a multilayer structure of X-ray reflectable material patterned on the substrate, wherein each layer of the multilayer structure has an edge with a slanted surface lying in a direction intersecting said substrate to form a common included angle with the slanted surface of each other layer such that the X-ray beam incident into the multilayer structure is reflected from the interfaces between the layers in a direction parallel to the slanted surfaces of said layers.

2. The reflection-type mask claimed in claim 1, wherein the slanted surfaces are smooth.

3. The reflection-type mask claimed in claim 1, wherein the slanted surfaces extend through the entire thickness of the multilayer structure along said edge.

4. The reflection-type mask claimed in claim 1, wherein the multilayer structure has a cross section forming a parallelogram with the slanted surfaces, and wherein said cross section is included in the incident face to the X-ray beam or parallel to the incident face.

5. The reflection-type mask claimed in claim 1, wherein the substrate is composed of a composition comprising silicon (Si) and wherein the multilayer structure comprises periodical layers of molybdenum (Mo) and silicon (Si).

6. Method of manufacturing a reflection-type mask for X-ray exposure using a beam of substantially parallel X-rays incident into the mask for generating reflected X-rays so as to form a mask pattern image, comprising:
(a) forming a multilayer structure of X-ray reflectable material upon a substrate composed of X-ray unreflectable material
(b) forming a resist pattern on the multilayer structure;
(c) irradiating a particle beam onto the resist pattern to effect etching of the multilayer structure in the form of a pattern following the resist pattern such that each patterned multilayer structure has an inclined surface along an edge thereof; and
(d) removing the resist pattern after the completion of the etching process.

7. The method claimed in claim 6, wherein substantially parallel ion beam is employed as the particle beam.

8. The method claimed in claim 7, wherein said ion beam is composed of inert gas molecules.

9. The method claimed in claim 7, wherein said ion beam is composed of reactive gas molecules.

10. The method claimed in claim 6, further comprising adjusting the incident angle of the particle beam to lie substantially parallel to the exit direction of the beam of X-rays after reflection from the multilayer structure.

11. The method claimed in claim 6, wherein said inclined surface is a smooth surface.

12. The method claimed in claim 6, wherein the inclined surface extends along said edge through the entire thickness of the multilayer.

13. Method of manufacturing a reflection-type mask for X-ray exposure using a beam of substantially parallel X-rays incident into the mask for generating reflected X-rays so as to form a mask pattern image, comprising:
(a) forming a multilayer structure of X-ray reflectable material by periodically forming layers of molybdenum (Mo) and silicon (Si) in sequence on the surface of a silicone substrate;
(b) forming a resist pattern on the multilayer structure;
(c) irradiating an ion beam onto the resist pattern to effect etching of the multilayer structure in the form of a pattern following the resist pattern such that each patterned multilayer structure has an inclined surface along an edge thereof; and
(d) removing the resist pattern after the completion of the etching process.

14. Method of manufacturing a reflection-type mask for X-ray exposure using a beam of substantially parallel X-rays incident into the mask for generating reflected X-rays so as to form a mask pattern image, comprising;
(a) forming a multilayer structure of X-ray reflectable material upon a substrate composed of X-ray unreflectable material;
(b) forming a plurality of resist layers upon said multilayer structure by forming a first resist layer on the multilayer structure for serving as a mask to the etching of the multilayer structure, forming an intermediate layer on the first resist layer for patterning the first resist layer, and forming a second resist layer on the intermediate layer for patterning the intermediate layer;
(c) initiating a first etching process for patterning the second resist layer into a mask pattern;
(d) initiating a second etching process for patterning the intermediate layer as an etching mask for the first resist layer after the first etching process;
(e) initiating a third etching process comprising irradiating a particle beam onto the patterned intermediate layer to effect etching of the first resist layer in the form of a pattern following the patterned intermediate layer such that each patterned first resist layer has an inclined surface along an edge thereof, subsequently etching the multilayer below the patterned first resist layer such that each patterned multilayer has an inclined surface along an edge thereof; and
(f) removing the first resist layer remaining on the multilayer after the completion of the third etching process.

15. The method claimed in claim 14, comprising forming the first and second resist layers from resin, and forming the intermediate layer from $SiO_2$.

\* \* \* \* \*